United States Patent
Selvaraj et al.

(10) Patent No.: US 10,317,248 B2
(45) Date of Patent: Jun. 11, 2019

(54) MULTIPLE-DISTANCE PROXIMITY SENSOR SYSTEMS

(71) Applicant: Honeywell International Inc., Morris Plains, NJ (US)

(72) Inventors: Radhakrishnan Selvaraj, Bangalore (IN); Anuradha Mohan, Bangalore (IN)

(73) Assignee: Honeywell International Inc., Morris Plains, NJ (US)

(*) Notice: Subject to any disclaimer, the term of this patent is extended or adjusted under 35 U.S.C. 154(b) by 296 days.

(21) Appl. No.: 15/333,575

(22) Filed: Oct. 25, 2016

(65) Prior Publication Data

US 2018/0113005 A1 Apr. 26, 2018

(51) Int. Cl.
*G01D 5/20* (2006.01)
*H03K 17/945* (2006.01)
*H03K 17/95* (2006.01)

(52) U.S. Cl.
CPC ......... *G01D 5/2006* (2013.01); *H03K 17/945* (2013.01); *H03K 17/9502* (2013.01); *H03K 17/952* (2013.01)

(58) Field of Classification Search
CPC ............... G01D 5/2006; H03K 17/945; H03K 17/9502; H03K 17/952
USPC .................................................... 324/207.16
See application file for complete search history.

(56) References Cited

U.S. PATENT DOCUMENTS

| 4,424,458 A | 1/1984 | Buck et al. |
| 8,319,500 B2 | 11/2012 | Tillotson |
| 8,723,532 B2 * | 5/2014 | Asjes ............... H03K 17/955 324/662 |
| 2013/0320996 A1 | 12/2013 | Tillotson |

FOREIGN PATENT DOCUMENTS

| WO | 8202536 A1 | 8/1982 |
| WO | WO-2009015665 A1 * | 2/2009 ........... H03K 17/945 |

OTHER PUBLICATIONS

Wolf, Translation of "Sensor System for the Open Circuit-Proof Detection of Objects", Feb. 4, 2009, EPO and Google (Year: 2009).*

* cited by examiner

*Primary Examiner* — Melissa J Koval
*Assistant Examiner* — Rahul Maini
(74) *Attorney, Agent, or Firm* — Craige Thompson; Thompson Patent Law (57) ABSTRACT

An apparatus comprises: a first comparator configured to: receive an input proximity signal indicating a proximity of a target device, receive a second reference signal associated with a second distance, make a first comparison of the input proximity signal to the second reference signal, and provide a first output proximity signal based on the first comparison; and a second comparator configured to: receive the input proximity signal, receive the first output proximity signal, make a second comparison of the input proximity signal using the first output proximity signal, and provide a second output proximity signal based on the second comparison.

20 Claims, 11 Drawing Sheets

| HEALTH MONITOR LOGIC | FIRST PROXIMITY | SECOND PROXIMITY | OUTPUT PROXIMITY | OUTPUT CURRENT |
|---|---|---|---|---|
| NO FAULT | NEAR | NEAR | VERY NEAR | 5 mA |
| NO FAULT | NEAR | FAR | NEAR | 8 mA |
| NO FAULT | FAR | NEAR | FAR | 11 mA |
| NO FAULT | FAR | FAR | VERY FAR | 14 mA |
| FAULT | NEAR OR FAR | NEAR OR FAR | FAULT | 0 mA |

MULTIPLE-DISTANCE PROXIMITY SENSOR SYSTEMS

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO A MICROFICHE APPENDIX

Not applicable.

BACKGROUND

A proximity sensor senses where a target device is in relation to a reference location and provides an output based on that sensing. A protection component uses the output to selectively enable or disable system components. As a first example, the proximity sensor senses that the target device is within a predetermined distance of the reference location, the proximity sensor provides to the protection component an output indicating that the target device is near, and the protection component disables a system. As a second example, the proximity sensor senses that the target device is beyond a predetermined distance of the reference location, the proximity sensor provides to the protection component an output indicating that the target device is far, and the protection component enables a system.

SUMMARY

In one embodiment, the disclosure includes an apparatus comprising: a first comparator configured to: receive an input proximity signal indicating a proximity of a target device, receive a second reference signal associated with a second distance, make a first comparison of the input proximity signal to the second reference signal, and provide a first output proximity signal based on the first comparison; and a second comparator configured to: receive the input proximity signal, receive the first output proximity signal, make a second comparison of the input proximity signal using the first output proximity signal, and provide a second output proximity signal based on the second comparison.

In another embodiment, the disclosure includes a method comprising: receiving an input proximity signal indicating a proximity of a target device; receiving a second reference signal associated with a second distance; making a first comparison of the input proximity signal to the second reference signal; providing a first output proximity signal based on the first comparison; receiving the first output proximity signal; making a second comparison of the input proximity signal using the first output proximity signal; and providing a second output proximity signal based on the second comparison.

In yet another embodiment, the disclosure includes a proximity sensor system comprising: a FAVCO sub-system; a target monitor coupled to the FAVCO sub-system and comprising n comparators configured to: compare 2n−1 distances, wherein n is a positive integer greater than 1, and provide 2n proximity outputs; a health monitor coupled to the FAVCO sub-system; and an output current controller coupled to the target monitor and the health monitor.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that, although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

The following acronyms and initialisms apply:
A: ampere(s)
BJT: bipolar junction transistor
FAVCO: fixed-amplitude, variable-current oscillator
kΩ: kilo-ohm(s)
mA: milliamp(s)
MOSFET: metal-oxide-semiconductor field-effect transistor
ms: millisecond(s)
MΩ: mega-ohm(s)
nF: nanofarad(s)
V: volt(s)
Ω: ohm(s).

Current proximity sensors provide outputs indicating proximities of target devices with respect to a single distance, or level. If a target device is within the distance, then the proximity sensor provides an output indicating a near proximity. If the target device is beyond the distance, then the proximity sensor provides an output indicating a far proximity. Such proximity sensors are described in U.S. Pat. No. 8,319,500 dated Nov. 27, 2012, and United States patent application publication number 2013/0320996 published Dec. 5, 2013, which are incorporated by reference. However, some systems require or benefit from proximity sensors that provide outputs based on multiple distances and indicating proximities such as very near, near, far, and very far. Those proximity sensors implement a number of comparators that is equal to or greater than a number of distances, thus increasing the size and cost of the proximity sensors. There is therefore a need for proximity sensors and proximity sensor systems that provide outputs based on multiple distances while using fewer comparators.

Disclosed herein are embodiments for multiple-distance proximity sensor systems. The proximity sensor systems comprise n comparators, where n is a positive integer greater than 1. The comparators detect, or compare, an input proximity signal to $2^n-1$ distances and provide $2^n$ proximity outputs based on the comparison. The input proximity signal is based on a distance of a target device to a coil. In contrast, other proximity sensor systems comprise $2^n-1$ comparators to detect $2^n-1$ distances. The disclosed proximity sensor systems therefore reduce the number of comparators, which reduces the size and the cost of those proximity sensor systems.

Figure 1A:
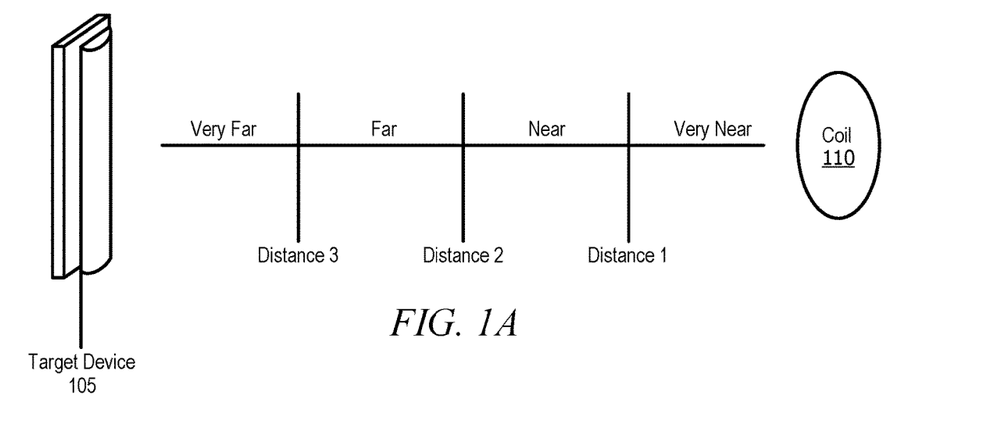
FIG. 1A is a schematic diagram illustrating proximities of a target device to a coil.

FIG. 1A is a schematic diagram illustrating proximities of a target device 105 to a coil 110. The target device 105 is of any shape and size and comprises ferrous material which may change a magnetic field of the coil 110. As described further below, that change may then provide information indicating whether the target device 105 is very near, near, far, or very far from the coil 110. For instance, if the target device 105 is within distance 1 from the coil, then the target device 105 is very near to the coil 110; if the target device 105 is between distance 1 and distance 2, then it is near to the coil 110; if the target device 105 is between distance 2 and distance 3, then it is far from the coil 110; and if the target device 105 is beyond distance 3 from the coil 110, then the target device 105 is very far from the coil 110.

Figure 1B:
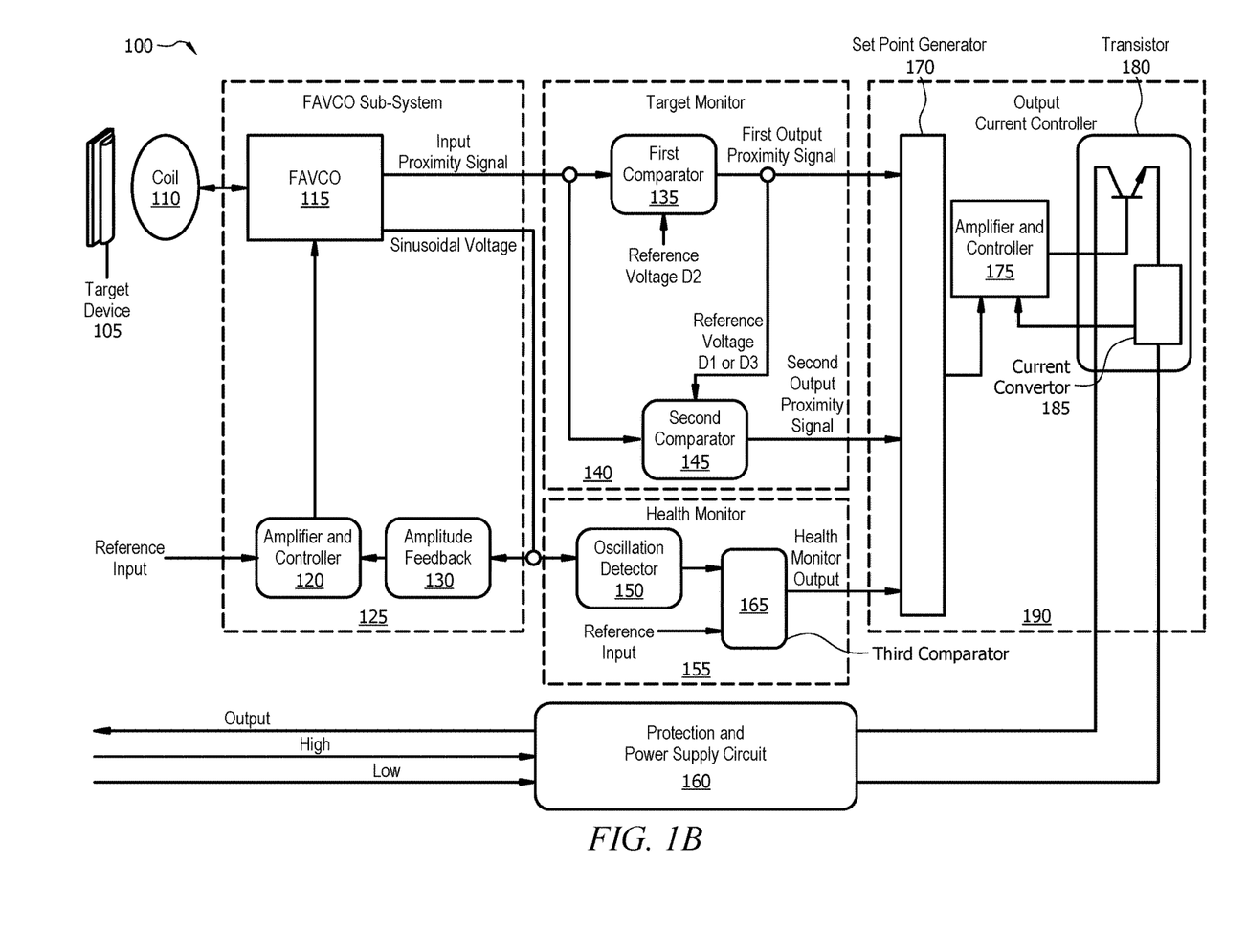
FIG. 1B is a schematic diagram of a proximity sensor system according to an embodiment of the disclosure.

FIG. 1B is a schematic diagram of a proximity sensor system 100 according to an embodiment of the disclosure. The proximity sensor system 100 generally comprises the target device 105, the coil 110, a FAVCO sub-system 125, a target monitor 140, a health monitor 155, an output current controller 190, and a protection and power supply circuit 160. The FAVCO sub-system 125, the target monitor 140, the health monitor 155, and the output current controller 190 make up a proximity sensor. The FAVCO sub-system 125 comprises a FAVCO 115, an amplifier and controller 120, and an amplitude feedback 130. The target monitor 140 comprises a first comparator 135 and a second comparator 145. The health monitor 155 comprises an oscillation detector 150 and a third comparator 165. The output current controller 190 comprises a set point generator 170, an amplifier and controller 175, a transistor 180, and a current converter 185.

In operation, the FAVCO 115 provides a sinusoidal voltage to the coil 110, which creates a magnetic field on the coil 110. Based on the proximity of the target device 105 to the coil 110, the magnetic field causes a gain of the FAVCO 115 to change. In response, the FAVCO 115 provides an input proximity signal to both the first comparator 135 and the second comparator 145. The input proximity signal is a voltage, which is higher when the target device 105 is closer to the coil 110 and lower when the target device 105 is farther from the coil 110.

The target monitor 140 provides a first output proximity signal and a second output proximity signal based on the input proximity signal and various reference voltages. The health monitor 155 detects a sinusoidal voltage from the coil 110 and the FAVCO 115 for the presence of suitable oscillation. If there is suitable oscillation, then the health monitor 155 provides a health monitor output indicating no fault. If there is not suitable oscillation, then the health monitor 155 provides the health monitor output indicating a fault. The target monitor 140 is described further below.

The output current controller 190 converts the first output proximity signal, the second output proximity signal, and the health monitor output to predetermined set points and converts those set points to currents. For instance, the output current controller 190 implements set points of 0.5 V for a very near proximity, 0.8 V for a near proximity, 1.1 V for a far proximity, 1.4 V for a very far proximity, and 0 V for a health monitor output indicating a fault. The output current controller 190 converts those voltages to 5 mA, 8 mA, 11 mA, 14 mA, and 0 mA, respectively. The current controller 190 is described further below.

The protection and power supply circuit 160 comprises three terminals, an output terminal, an input high terminal, and an input low terminal. The output terminal provides the final output current from the output current controller 190. The input high terminal provides a regulated voltage of, for instance, 5 V to the rest of the proximity sensor system 100. The input low terminal provides a ground. The protection and power supply circuit 160 further provides protection against over-voltages and reverse polarity voltages at the output terminal and the input high terminal.

Figure 2:
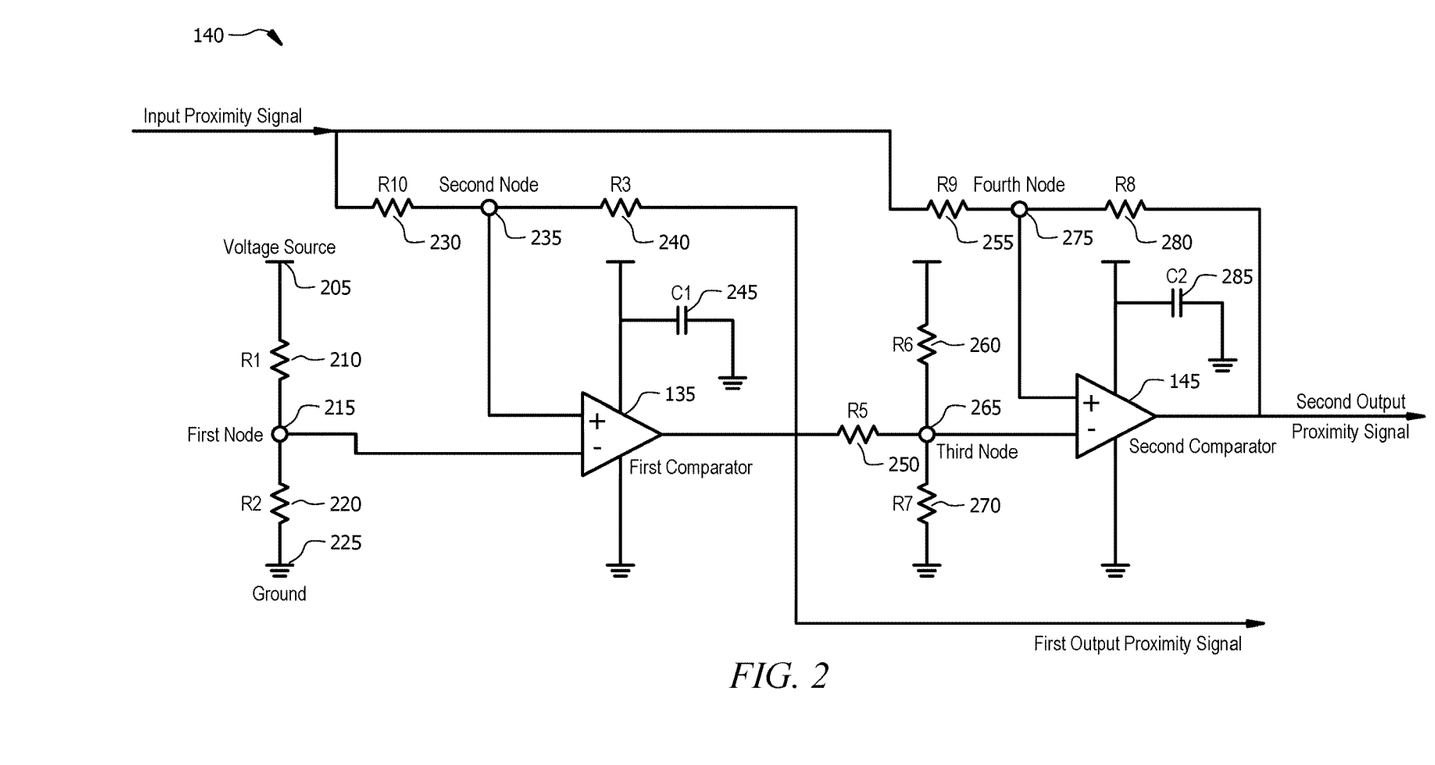
FIG. 2 is a schematic diagram of the target monitor in FIG. 1.

FIG. 2 is a schematic diagram of the target monitor 140 in FIG. 1. The target monitor 140 comprises the first comparator 135 and the second comparator 145 shown in FIG. 1. In addition, the target monitor 140 comprises a voltage source 205; resistors 210, 220, 230, 240, 250, 255, 260, 270, 280; a first node 215; a second node 235, a third node 265, and a fourth node 275; and capacitors 245, 285. As an example, the voltage source 205 provides 5 V; the resistors 210, 220, 230, 240, 250, 255, 260, 270, 280 provide resistances of 34 kΩ, 4.53 kΩ, 2 kΩ, 1 MΩ, 232 kΩ, 2 kΩ, 36.5 kΩ, 4.53 kΩ, and 1 MΩ, respectively; and the capacitors 245, 285 provide capacitances of 10 nF.

Using two comparators, the first comparator 135 and the second comparator 145, the target monitor 140 implements three-distance detection and therefore provides four proximity outputs. Those outputs may be referred to as very near, near, far, and very far. The first comparator 135 compares a voltage at the second node 235, which is associated with the input proximity signal, to a voltage at the first node 215, which is a reference voltage for a second distance D2. The first comparator 135 then provides a first output proximity signal based on that comparison. The second comparator 145 compares a voltage at the fourth node 275, which is associated with the input proximity signal, to a voltage at the third node 265, which is associated with an output of the first comparator 135 and is a reference voltage for either a first distance D1 or a second distance D2. The second comparator 145 then provides a second output proximity signal based on that comparison.

Figure 3:
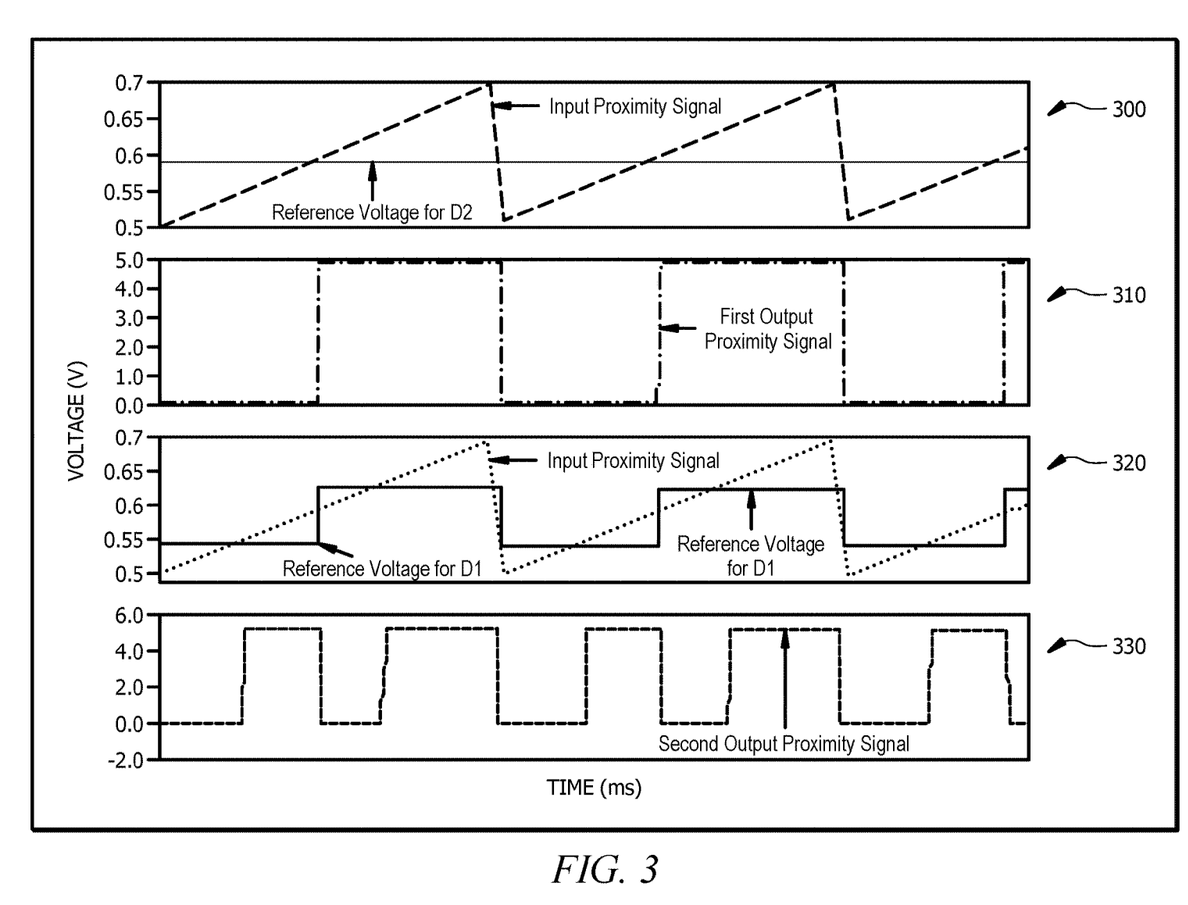
FIG. 3 is a series of graphs for the target monitor in FIGS. 1 and 2.

FIG. 3 is a series of graphs 300, 310, 320, 330 for the target monitor 140 in FIGS. 1 and 2. The x-axes represent time in milliseconds, and the y-axes represent voltage in volts. The graph 300 shows the input proximity signal and a reference voltage for D2. The input proximity signal twice increases from 0.5 V and reaches a peak of 0.7 V, indicating that the target device 105 twice approaches the coil 110. In addition, the reference voltage for D2 at the first node 215 stays flat at about 0.59 V. The graph 310 shows a first output proximity signal. When input proximity signal exceeds the reference voltage for D2 in the graph 300, the first output proximity signal transitions from a low voltage of 0 V to a high voltage of 5 V in the graph 310.

The graph 320 shows the input proximity signal and the reference voltage for a first distance D1 and a third distance D3. The reference voltage is about 0.55 V for D1 and about 0.64 V for D2. The graph 330 shows a second output proximity signal. When the first output proximity signal in the graph 310 is low, the second output proximity signal depends on the reference voltage for D1. In that case, as the input proximity signal exceeds the reference voltage for D1 in the graph 320, the second output proximity signal transitions from a low voltage of 0 V to a high voltage of about 5 V in the graph 330. However, when the first output proximity signal in the graph 310 is high, the second output proximity signal depends on the reference voltage for D3. In that case, as the input proximity signal exceeds the reference voltage for D3 in the graph 320, the second output proximity signal transitions from a low voltage of 0 V to a high voltage of about 5 V in the graph 330.

Figure 4:
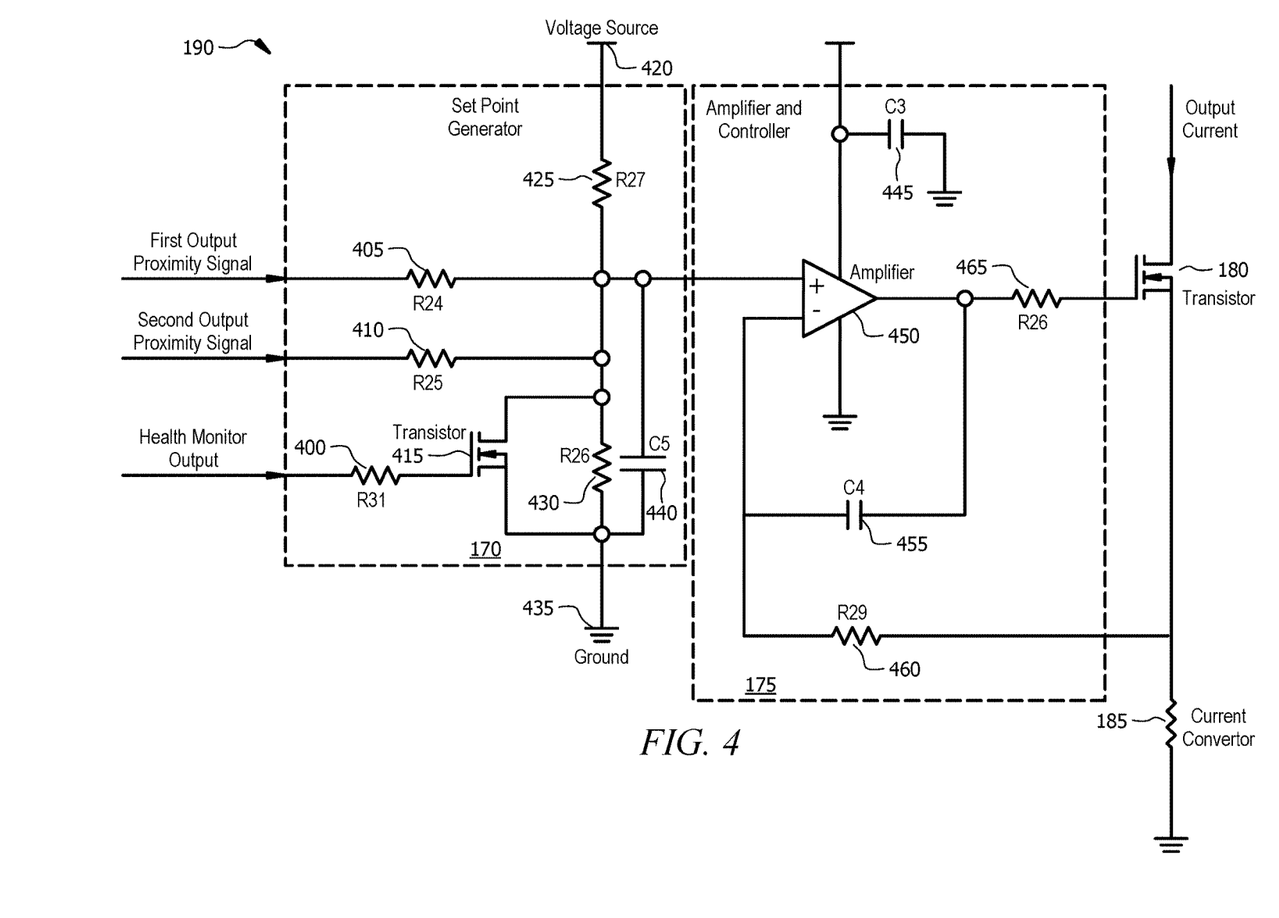
FIG. 4 is a schematic diagram of the output current controller in FIG. 1.

FIG. 4 is a schematic diagram of the output current controller 190 in FIG. 1. The output current controller 190 generally comprises a voltage source 420, the set point generator 170, a ground 435, the amplifier and controller 175, the transistor 180, and the current converter 185. The set point generator 170 comprises resistors 400, 405, 410, 425, 430; a transistor 415; and a capacitor 440. The amplifier and controller 175 comprises capacitors 445, 455; an amplifier 450; and resistors 460, 465. The transistor 180 is a BJT or a MOSFET. As shown, the current converter 185 may be a resistor. As an example, the resistors 400, 405, 410, 425, 430, 460, 465 and the current converter 185 provide resistances of 10 kΩ, 100 kΩ, 49.9 kΩ, 60 kΩ, 8.3 kΩ, 100 kΩ, 10 kΩ, and 100 kΩ, respectively; the voltage source 420 provides 5 V; and the capacitors 440, 445, 455 provide capacitances of 4.7 nF, 10 nF, and 1 nF, respectively.

Figure 5:
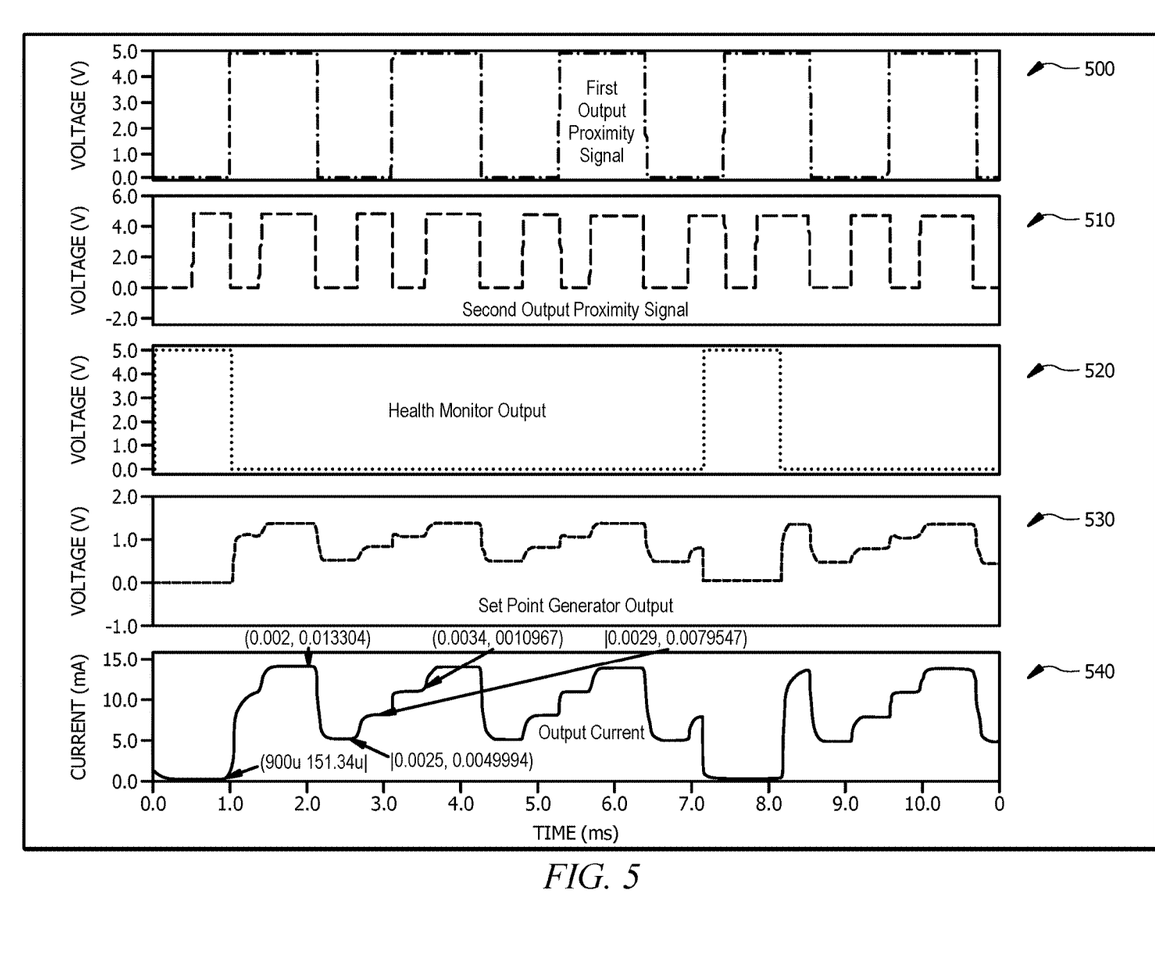
FIG. 5 is a series of graphs for the output current controller in FIGS. 1 and 4.

FIG. 5 is a series of graphs 500, 510 520, 530, 540 for the output current controller 190 in FIGS. 1 and 4. The x-axes represent time in milliseconds, and the y-axes represent voltage in volts for the graphs 500, 510, 520, 530 and current in milliamps for the graph 540. At 0 ms, the health monitor output in the graph 520 is high because the health monitor 155 detects a fault, so the set point generator output in the graph 530 is 0 V and the output current in the graph 540 is 0 mA. Thereafter, the health monitor output in the graph 520 is low because the health monitor 155 does not detect a fault.

At 1 ms, the first output proximity signal in the graph 500 is high and the second output proximity signal in the graph 510 is low, so the set point generator output in the graph 530 is 1.1 V and the output current in the graph 540 is 11 mA. At about 1.4 ms, both the first output proximity signal in the graph 500 and the second output proximity signal in the graph 510 are high, so the set point generator output in the graph 530 is 1.4 V and the output current in the graph 540 is 14 mA. At about 2 ms, both the first output proximity signal in the graph 500 and the second output proximity signal in the graph 510 are low, so the set point generator output in the graph 530 is 0.5 V and the output current in the graph 540 is 5 mA. At about 2.6 ms, the first output proximity signal in the graph 500 is low and the second output proximity signal in the graph 510 is high, so the set point generator output in the graph 530 is 0.8 V and the output current in the graph 540 is 8 mA.

Figure 6:
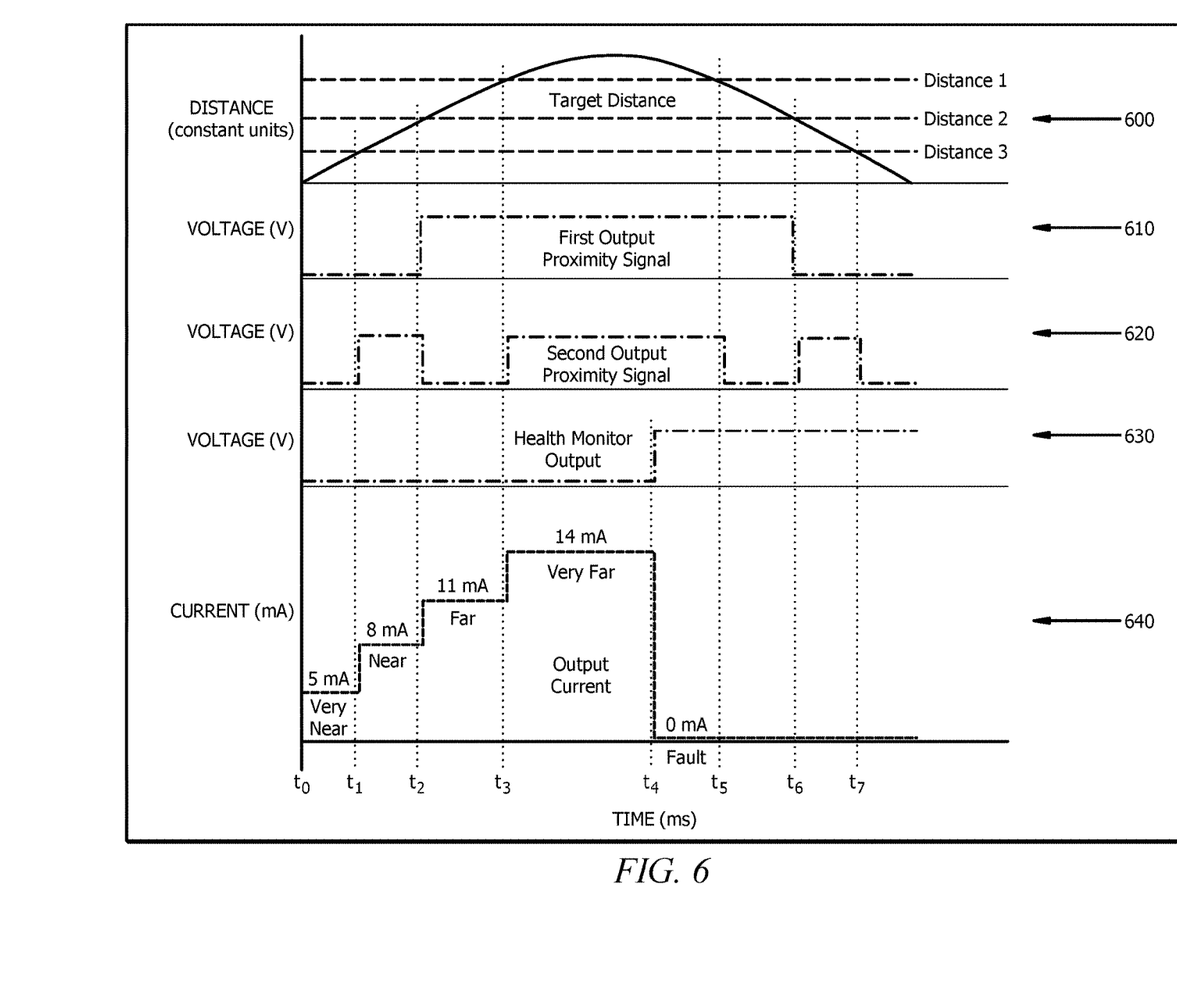
FIG. 6 is a series of graphs for the proximity sensor system in FIG. 1.

FIG. 6 is a series of graphs 600, 610, 620, 630, 640 for the proximity sensor system 100 in FIG. 1. The graphs 600-640 combine and simplify the graphs 300-330 in FIG. 3 and the graphs 500-540 in FIG. 5. The x-axes represent time in milliseconds, the y-axis for the graph 600 represents distance in constant units, the y-axes for the graphs 610-630 represent voltage in volts, and the y-axis represents for the graph 640 represents current in milliamps.

From time $t_0$ to time $t_1$, the health monitor output in the graph 630 is low to indicate no fault. From time $t_0$ to time $t_1$, both the first output proximity signal in the graph 610 and the second output proximity signal in the graph 620 are low, so the output current in the graph 640 is 5 mA to indicate that the target device 105 is very near. From time $t_1$ to time $t_2$, the first output proximity signal in the graph 610 is low and the second output proximity signal in the graph 620 is high, so the output current in the graph 640 is 8 mA to indicate that the target device 105 is near. From time $t_2$ to time $t_3$, the first output proximity signal in the graph 610 is high and the second output proximity signal in the graph 620 is low, so the output current in the graph 640 is 11 mA to indicate that the target device 105 is far. From time $t_3$ to time $t_4$, the first output proximity signal in the graph 610 is high and the second output proximity signal in the graph 620 is high, so the output current in the graph 640 is 14 mA to indicate that the target device 105 is very far. Finally, from time $t_4$ to time $t_7$ and beyond, the health monitor output in the graph 630 is high, so the output current in the graph 640 is 0 mA to indicate a fault.

Figure 7:
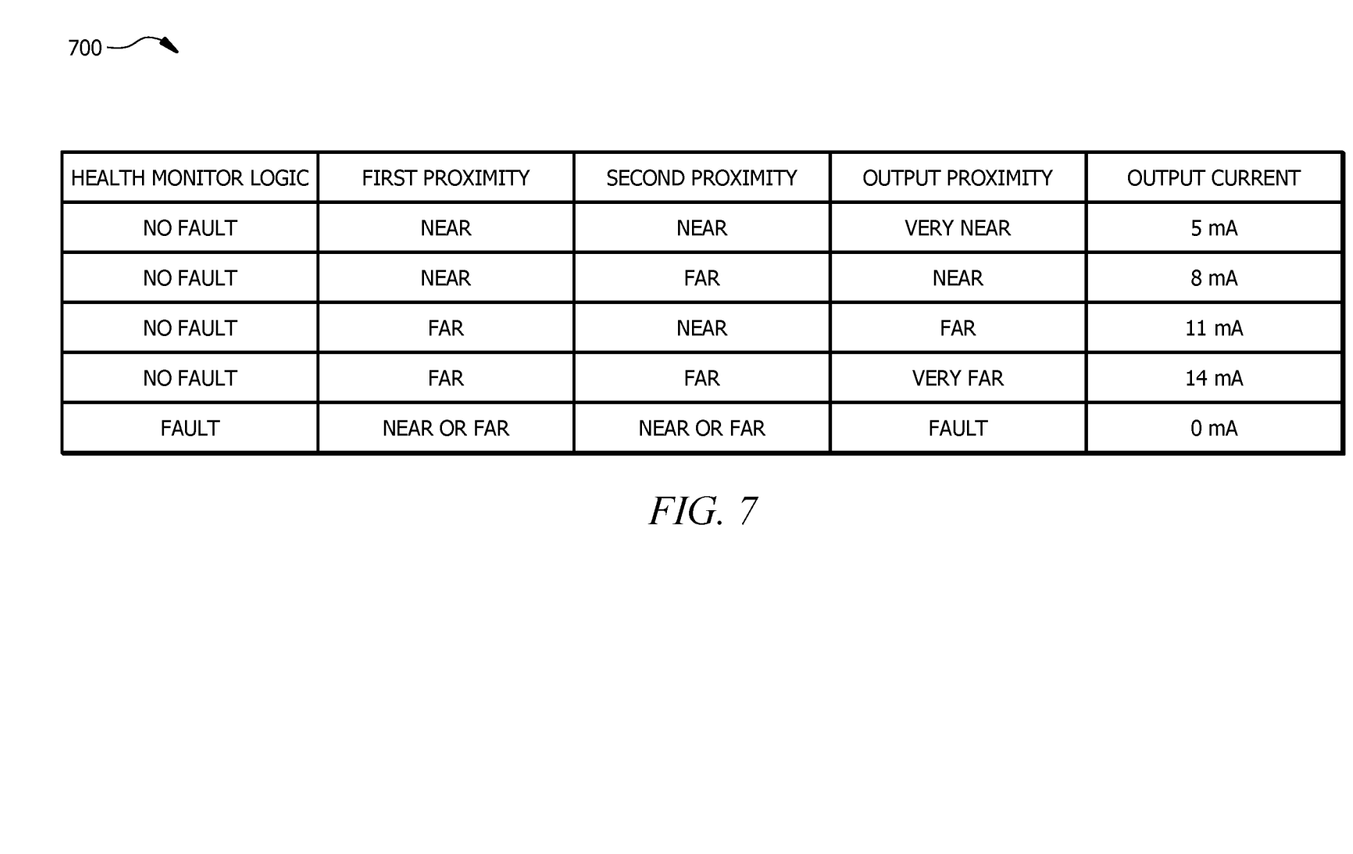
FIG. 7 is a logic table of the graphs in FIG. 6.

FIG. 7 is a logic table 700 of the graphs 600-640 in FIG. 6. The health monitor logic corresponds to the health monitor output, the first proximity corresponds to the first output proximity signal, the second proximity corresponds to the second output proximity signal, the output proximity corresponds to an output of the set point generator 170, and the output current is the same as the output current in the graph 540. Thus, for the health monitor logic, no fault corresponds to a low health monitor output and fault corresponds to a high health monitor output. For the first proximity and the second proximity, near corresponds to a low first output proximity signal or a low second output proximity signal and far corresponds to a high first output proximity signal or a high second output proximity signal. The output proximity corresponds to a combination of the first proximity and the second proximity.

The first output proximity signal results from the first comparator 135 determining the first proximity of the target device 105 with respect to the second distance D2. When the first proximity is near, the second output proximity signal results from the second comparator 145 determining the second proximity of the target device 105 with respect to the first distance D1. When the first proximity is far, the second output proximity signal results from the second comparator 145 determining the second proximity of the target device 105 with respect to the third distance D3. When the health monitor logic indicates no fault, then the proximity sensor system 100 maintains the logic above. Otherwise, when the health monitor logic indicates a fault, then the output is a fault regardless of the first proximity and the second proximity.

As can be seen, the proximity sensor system 100 provides five logical outputs, very near, near, far, very far, and fault. The proximity sensor system 100 does so using three distances, D1-D3, to compare the target device 105 to. The proximity sensor system 100 further does so using two comparators, the first comparator 135 and the second comparator 145. In short, the proximity sensor system 100 implements two comparators; three distances; and five logical outputs, which include four proximities and a fault output.

Figure 8:
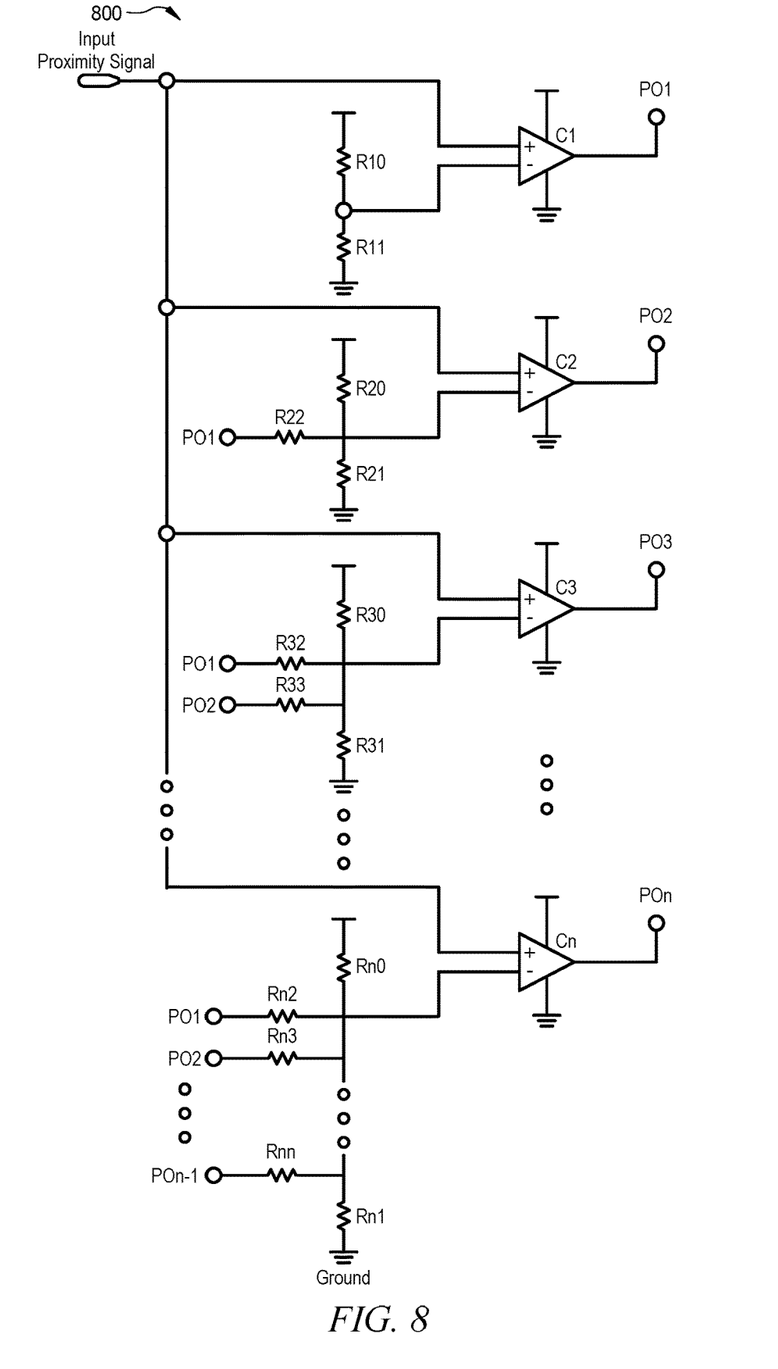
FIG. 8 is a schematic diagram of a generalized target monitor according to an embodiment of the disclosure.

FIG. 8 is a schematic diagram of a generalized target monitor 800 according to an embodiment of the disclosure.

The generalized target monitor 800 comprises the input proximity signal, a plurality of resistors denoted as R10-Rnn, and n comparators denoted as C1-Cn that provide n proximity output signals denotes as PO1-POn. The generalized target monitor 800 generalizes the target monitor 140 to n comparators, where n is a positive integer of three or greater. Using the n comparators, the generalized target monitor 800 implements ($2^n-1$)-distance detection and therefore provides $2^n$ proximity outputs. In contrast, other target monitors and corresponding proximity sensor systems comprise $2^n-1$ comparators to implement ($2^n-1$)-distance detection. The generalized target monitor 800 therefore reduces the number of comparators, which reduces the size and the cost of the generalized target monitor 800 compared to other target monitors.

Figure 9:
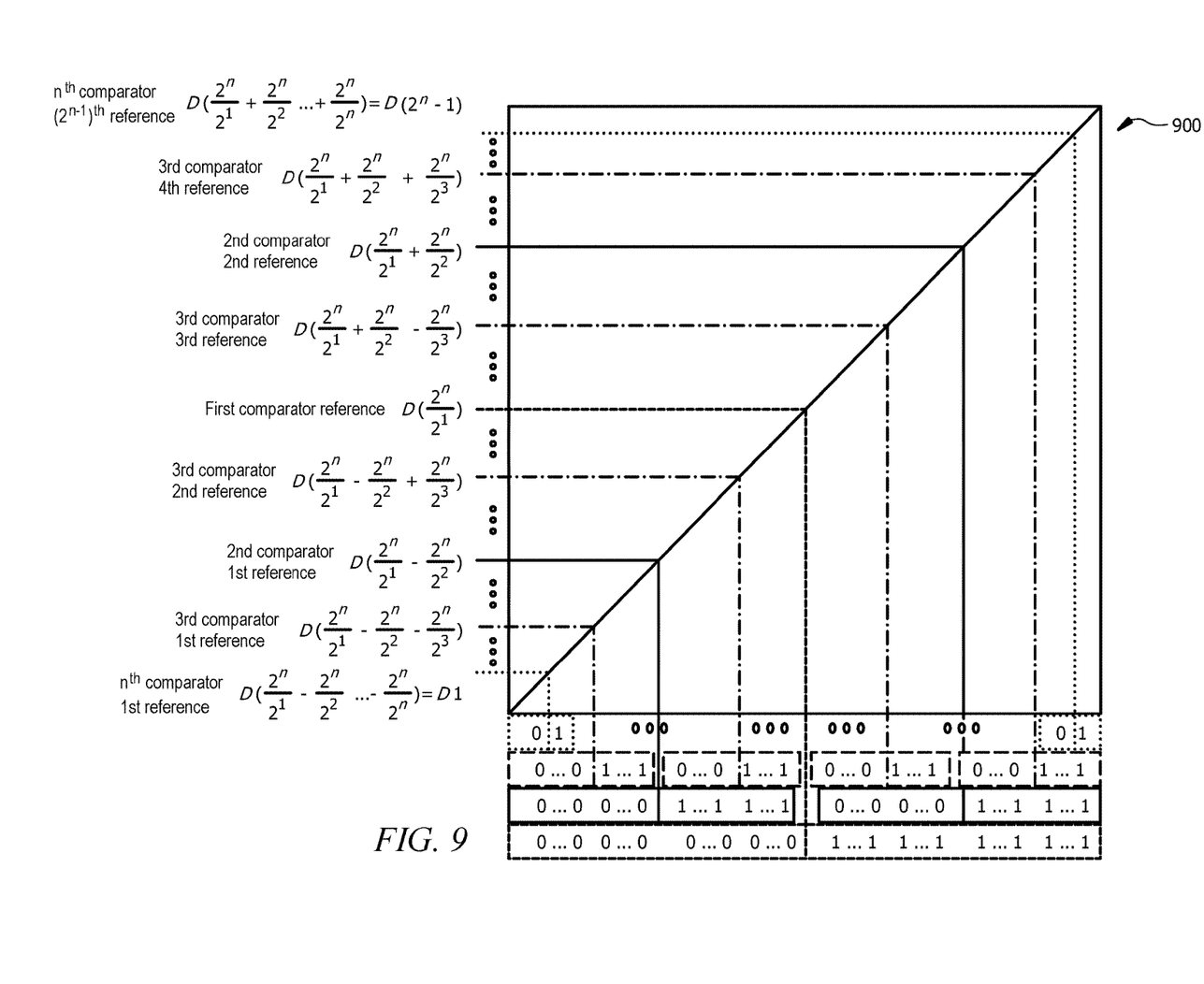
FIG. 9 is a logic table for the generalized target monitor in FIG. 8.

FIG. 9 is a logic table 900 for the generalized target monitor 800 in FIG. 8. The first comparator C1 compares a proximity input signal to a distance $D(2^n/2^1)$ and provides a first output proximity signal PO1 based on that comparison. When PO1 is low, the second comparator C2 compares the proximity input signal to a distance $D(2^n/2^1-2^n/2^2)$ and provides a second output proximity signal PO2 based on that comparison. Otherwise, when PO1 is high, the second comparator C2 compares the proximity input signal to a distance $D(2^n/2^1-2^n/2^2)$ and provides the second output proximity signal PO2 based on that comparison. The remaining comparators make similar comparisons and provide similar output proximity signals as shown. Alternatively, logic low values and logic high values may be used in the opposite manner.

Figure 10:
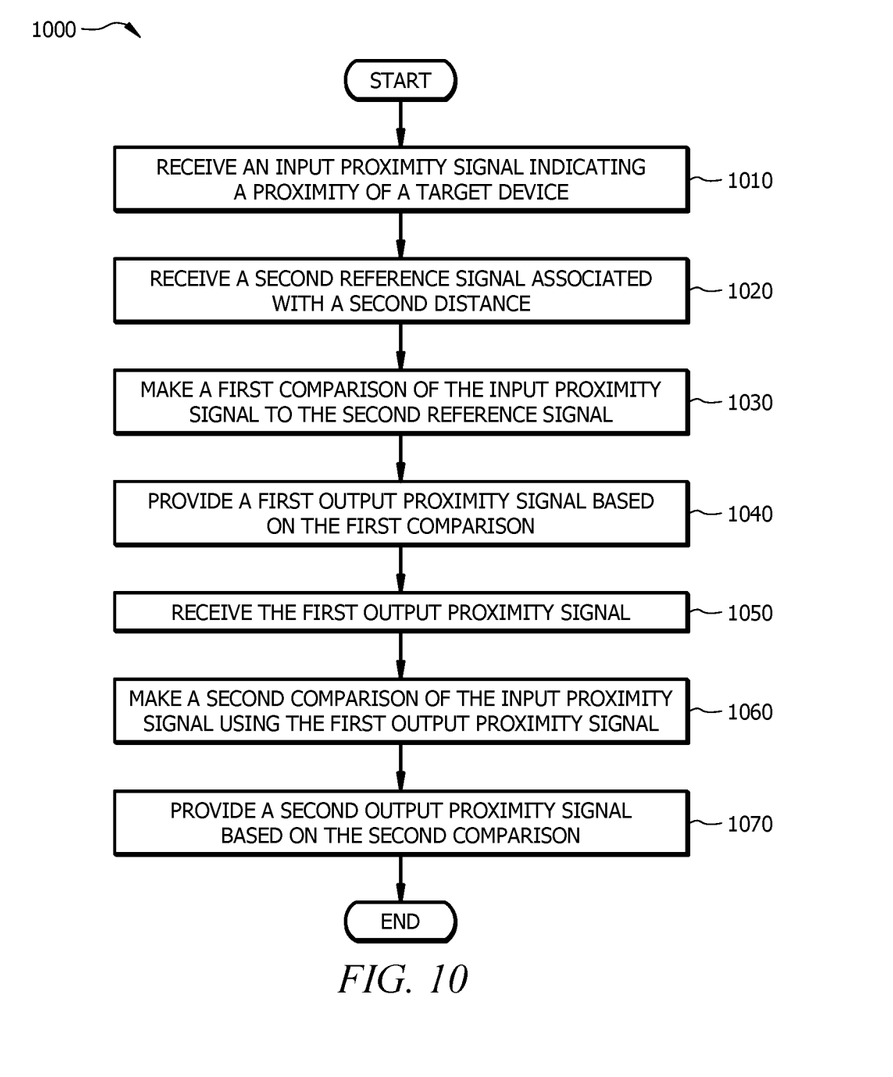
FIG. 10 is a flowchart illustrating a method of distance detection according to an embodiment of the disclosure.

FIG. 10 is a flowchart illustrating a method 1000 of distance detection according to an embodiment of the disclosure. The proximity sensor system 100, the target monitor 140, and the generalized target monitor 800 implement the method. At step 1010, an input proximity signal indicating a proximity of a target device is received. For instance, the first comparator 135 and the second comparator 145 receive the input proximity signal. At step 1020, a second reference signal associated with a second distance is received. For instance, the first comparator 135 receives the reference voltage for the second distance D2. At step 1030, a first comparison of the input proximity signal to the second reference signal is made. For instance, the first comparator 135 makes the first comparison. At step 1040, a first output proximity signal based on the first comparison is provided. For instance, the first comparator 135 provides the first output proximity signal to the set point generator 170.

At step 1050, a first output proximity signal is received. For instance, the second comparator 145 receives the first output proximity signal from the first comparator 135. At step 1060, a second comparison of the input proximity signal is made using the first output proximity signal. For instance, the second comparator 145 makes the second comparison depending on whether the first output proximity signal is low or high. Finally, at step 1070, a second output proximity signal based on the second comparison is provided. For instance, the second comparator 145 provides the second output proximity signal to the set point generator 170.

A first component is directly coupled to a second component when there are no intervening components, except for a line, a trace, or another medium between the first component and the second component. The first component is indirectly coupled to the second component when there are intervening components other than a line, a trace, or another medium between the first component and the second component. The term "coupled" and its variants include both directly coupled and indirectly coupled. The use of the term "about" means a range including ±10% of the subsequent number unless otherwise stated.

Although a few embodiments have been described in detail above, other modifications are possible. For example, the logic flows depicted in the figures do not require the particular order shown, or sequential order, to achieve desirable results. Other steps may be provided, or steps may be eliminated, from the described flows, and other components may be added to, or removed from, the described systems. Other embodiments may be within the scope of the following claims.

While several embodiments have been provided in the present disclosure, it may be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, components, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

What is claimed is:

1. An apparatus comprising:
   a first comparator configured to:
     receive an input proximity signal indicating a proximity of a target device to a proximity sensor,
     receive a first reference signal associated with a first distance,
     make a first comparison of the input proximity signal to the first reference signal, and
     provide a first output proximity signal based on the first comparison;
   a second comparator configured to:
     receive the input proximity signal,
     receive the first output proximity signal,
     make a second comparison of the input proximity signal using the first output proximity signal, and
     provide a second output proximity signal based on the second comparison, and
   an output current controller configured to generate proximities based on the first output proximity signal and the second output proximity signal, wherein the proximities comprise a first proximity, a second proximity more distant than the first proximity, a third proximity more distant than the second proximity, and a fourth proximity more distant than the third proximity.

2. The apparatus of claim 1, wherein the second comparator is further configured to receive a second reference signal associated with a second distance, and wherein the second comparison is between the input proximity signal and the second reference signal when the first output proximity signal is a logical low.

3. The apparatus of claim 2, wherein the second comparator is further configured to receive a third reference signal associated with a third distance, and wherein the second comparison is between the input proximity signal and the third reference signal when the first output proximity signal is a logical high.

4. The apparatus of claim 1, further comprising at least one additional comparator so that the apparatus comprises n comparators including the first comparator and the second comparator, wherein n is an integer greater than 2, and wherein the comparators are configured to compare $2^n-1$ distances.

5. The apparatus of claim 4, wherein the comparators are further configured to provide $2^n$ proximity outputs.

6. The apparatus of claim 1, further comprising a coil, wherein the input proximity signal further indicates the proximity of the target device to the coil.

7. The apparatus of claim 1, further comprising a health monitor configured to:
   make a determination as to whether a sinusoidal voltage has a suitable oscillation, and
   provide a health monitor output based on the determination.

8. A method comprising:
   receiving an input proximity signal indicating a proximity of a target device to a proximity sensor;
   receiving a first reference signal associated with a first distance;
   making a first comparison of the input proximity signal to the first reference signal;
   providing a first output proximity signal based on the first comparison;
   receiving the first output proximity signal;
   making a second comparison of the input proximity signal using the first output proximity signal;
   providing a second output proximity signal based on the second comparison; and
   generating proximities based on the first output proximity signal and the second output proximity signal, wherein the proximities comprise a first proximity, a second proximity more distant than the first proximity, a third proximity more distant than the second proximity, and a fourth proximity more distant than the third proximity.

9. The method of claim 8, further comprising receiving a second reference signal associated with a second distance, wherein the second comparison is between the input proximity signal and the second reference signal when the first output proximity signal is a logical low.

10. The method of claim 9, further comprising receiving a third reference signal associated with a third distance, wherein the second comparison is between the input proximity signal and the third reference signal when the first output proximity signal is a logical high.

11. The method of claim 8, further comprising:
   comparing $2^n-1$ distances using n comparators, wherein n is a positive integer greater than 1; and
   providing $2^n$ proximity outputs using the comparators.

12. The method of claim 8, wherein the input proximity signal further indicates the proximity of the target device to a coil.

13. The method of claim 8, further comprising:
   determining whether a sinusoidal voltage has a suitable oscillation; and
   providing a health monitor output based on the determination.

14. An apparatus comprising:
   a first comparator configured to:
      receive an input proximity signal indicating a proximity of a target device to a proximity sensor,
      receive a first reference signal associated with a first distance,
      make a first comparison of the input proximity signal to the first reference signal, and
      provide a first output proximity signal based on the first comparison;
   a second comparator configured to:
      receive the input proximity signal,
      receive the first output proximity signal,
      make a second comparison of the input proximity signal using the first output proximity signal, and
      provide a second output proximity signal based on the second comparison; and
   at least one additional comparator so that the apparatus comprises n comparators including the first comparator and the second comparator, wherein n is an integer greater than 2, and wherein the comparators are configured to compare $2^n-1$ distances.

15. The apparatus of claim 14, wherein the second comparator is further configured to receive a second reference signal associated with a second distance, and wherein the second comparison is between the input proximity signal and the second reference signal when the first output proximity signal is a logical low.

16. The apparatus of claim 15, wherein the second comparator is further configured to receive a third reference signal associated with a third distance, and wherein the second comparison is between the input proximity signal and the third reference signal when the first output proximity signal is a logical high.

17. The apparatus of claim 14, further comprising at least one additional comparator so that the apparatus comprises n comparators including the first comparator and the second comparator, wherein n is an integer greater than 2, and wherein the comparators are configured to compare $2^n-1$ distances.

18. The apparatus of claim 17, wherein the comparators are further configured to provide $2^n$ proximity outputs.

19. The apparatus of claim 14, further comprising a coil, wherein the input proximity signal further indicates the proximity of the target device to the coil.

20. The apparatus of claim 14, further comprising a health monitor configured to:
   make a determination as to whether a sinusoidal voltage has a suitable oscillation, and
   provide a health monitor output based on the determination.

* * * * *